United States Patent
Wahlsten

(10) Patent No.: US 9,210,814 B2
(45) Date of Patent: Dec. 8, 2015

(54) APPARATUSES AND METHODS FOR COMPENSATION OF CARRIER DISTORTIONS FROM MEASUREMENT MACHINES

(75) Inventor: Mikael Wahlsten, Stockholm (SE)

(73) Assignee: MYCRONIC AB, Taby (SE)

( * ) Notice: Subject to any disclaimer, the term of this patent is extended or adjusted under 35 U.S.C. 154(b) by 1088 days.

(21) Appl. No.: 13/233,621

(22) Filed: Sep. 15, 2011

(65) Prior Publication Data

US 2012/0062862 A1  Mar. 15, 2012

Related U.S. Application Data

(60) Provisional application No. 61/383,312, filed on Sep. 15, 2010.

(51) Int. Cl.
| | |
|---|---|
| *G03B 27/68* | (2006.01) |
| *H05K 3/00* | (2006.01) |
| *G03F 7/20* | (2006.01) |
| *G03F 9/00* | (2006.01) |
| *H05K 1/02* | (2006.01) |
| *H05K 3/46* | (2006.01) |

(52) U.S. Cl.
CPC ............ *H05K 3/0008* (2013.01); *G03F 7/2053* (2013.01); *G03F 9/00* (2013.01); *H05K 1/0269* (2013.01); *H05K 3/4638* (2013.01); *H05K 2201/09918* (2013.01); *H05K 2203/163* (2013.01)

(58) Field of Classification Search
CPC ....... G03F 7/2053; G03F 9/00; H05K 1/0269; H05K 2201/09918; H05K 2203/163; H05K 3/0008; H05K 3/4638
USPC .............................. 355/52; 356/399, 400, 401
See application file for complete search history.

(56) References Cited

U.S. PATENT DOCUMENTS

| | | | |
|---|---|---|---|
| 2009/0034860 A1* | 2/2009 | Hirashima | .................... 382/254 |
| 2011/0210104 A1 | 9/2011 | Wahlsten et al. | |
| 2011/0213479 A1 | 9/2011 | Wahlsten et al. | |
| 2011/0213484 A1 | 9/2011 | Wahlsten et al. | |
| 2011/0228242 A1 | 9/2011 | Wahlsten et al. | |
| 2011/0257777 A1 | 10/2011 | Wahlsten et al. | |

OTHER PUBLICATIONS

International Search Report and Written Opinion dated Apr. 5, 2012 issued in International Application No. PCT/IB2011/002153.

\* cited by examiner

*Primary Examiner* — Peter B Kim
(74) *Attorney, Agent, or Firm* — Harness, Dickey & Pierce, P.L.C.

(57) ABSTRACT

In a method for generating a pattern on a workpiece having at least one die placed thereon, positions of the at least one die and at least two global alignment marks on the workpiece are measured, pattern adjustment data is generated, pattern image data associated with the pattern to be written is adjusted based on the generated pattern adjustment data, and the pattern is generated on the workpiece based on the modified pattern adjustment data.

5 Claims, 6 Drawing Sheets

APPARATUSES AND METHODS FOR COMPENSATION OF CARRIER DISTORTIONS FROM MEASUREMENT MACHINES

CROSS-REFERENCE TO RELATED APPLICATION(S)

This application claims the benefit of provisional patent application No. 61/383,312, filed on Sep. 15, 2010, the entire contents of which are incorporated herein by reference.

BACKGROUND

1. Field

Example embodiments relate to methods and apparatuses for performing pattern alignment to die, and methods and apparatuses for patterning a workpiece.

2. Description of Conventional Art

In a fan-out or embedded die process, dies (of one or several types) are placed on a workpiece. After the dies have been placed on the workpiece, one or more patterning steps are performed on the workpiece. Conventionally, each die must be placed on the workpiece relatively accurately because patterning equipment (e.g., aligners, steppers, etc.) has only limited capability to individually align each die without significantly sacrificing throughput (e.g., TAKT).

Recent advances in Laser Direct Imaging (LDI) technology have enabled compensation for misplacement of each die. However, at least some of the die's positions must be measured relative to some global coordinate system or some other reference point. Such a measurement may be performed in an exposure (writing) tool or in a separate measurement tool. However, the workpiece has a non-neglectable distortion when it is measured. If one does not compensate for this distortion, then an error may be introduced when the workpiece is exposed/patterned.

SUMMARY

At least one example embodiment provides a method for generating a pattern on a workpiece having at least one die placed thereon, the method including: measuring first positions of the at least one die and at least two global alignment marks on the workpiece as placed in a measurement tool; updating nominal positions of the at least two global alignment marks based on the measured first positions of the at least two global alignment marks; measuring second positions of the at least two global alignment marks on the workpiece as placed in a writing tool; calculating a global alignment transformation based on the updated nominal positions and the measured second positions of the at least two global alignment marks; generating pattern adjustment data by applying the global alignment transformation to the measured first positions of the at least one die on the workpiece; modifying pattern image data associated with the pattern based on the generating pattern adjustment data; and generating the pattern on the workpiece based on the modified pattern image data.

According to at least some example embodiments, the pattern image data may be modified by re-sampling the pattern image data associated based on the pattern adjustment data.

The generating of the pattern adjustment data may further include: transforming the measured first positions of the at least one die into a coordinate system of the writing tool using the global alignment transformation.

The updating of the nominal positions may further include: calculating a deviation between the nominal positions and the measured first positions of the at least two global alignment marks; and updating the nominal positions based on the calculated deviation.

The deviation may be a dx,dy deviation of the measured first positions of the at least two global alignment marks from the nominal positions.

At least one other example embodiment provides a method for generating a pattern on a workpiece having at least one die placed thereon, the method including: measuring first positions of the at least one die and at least two global alignment marks on the workpiece as placed in a measurement tool; calculating a measurement tool alignment transformation based on the measured first positions of the at least two global alignment marks; measuring second positions of the at least two global alignment marks on the workpiece as placed in a writing tool; calculating a measurement tool alignment transformation based on the measured second positions of the at least two global alignment marks; generating pattern adjustment data based on the measurement tool alignment transformation and the writing tool alignment transformation; modifying pattern image data associated with the pattern based on the generated pattern adjustment data; and generating the pattern on the workpiece based on the modified pattern adjustment data.

At least one other example embodiment provides a method for generating a pattern on a workpiece having at least one die placed thereon, the method including: measuring first positions of the at least one die and at least two global alignment marks on the workpiece as placed in a measurement tool; calculating a measurement tool alignment transformation based on the measured first positions of the at least two global alignment marks and a priori information regarding a transformation used in the writing tool; measuring second positions of the at least two global alignment marks on the workpiece as placed in a writing tool; calculating a measurement tool alignment transformation based on the measured second positions of the at least two global alignment marks; generating pattern adjustment data based on the measurement tool alignment transformation and the writing tool alignment transformation; modifying pattern image data associated with the pattern based on the generated pattern adjustment data; and generating the pattern on the workpiece based on the modified pattern adjustment data.

According to at least some example embodiments, the method may further include: computing a total transformation by combining the measurement tool alignment transformation and the writing tool alignment transformation; and wherein the pattern adjustment data is generated based on the total transformation.

The generating of the pattern adjustment data may further include: transforming the measured first positions of the at least one die into a coordinate system of the writing tool using the total transformation.

BRIEF DESCRIPTION OF THE DRAWINGS

Example embodiments will become more apparent from the following description of the drawings in which.

DETAILED DESCRIPTION

Figure 1A:
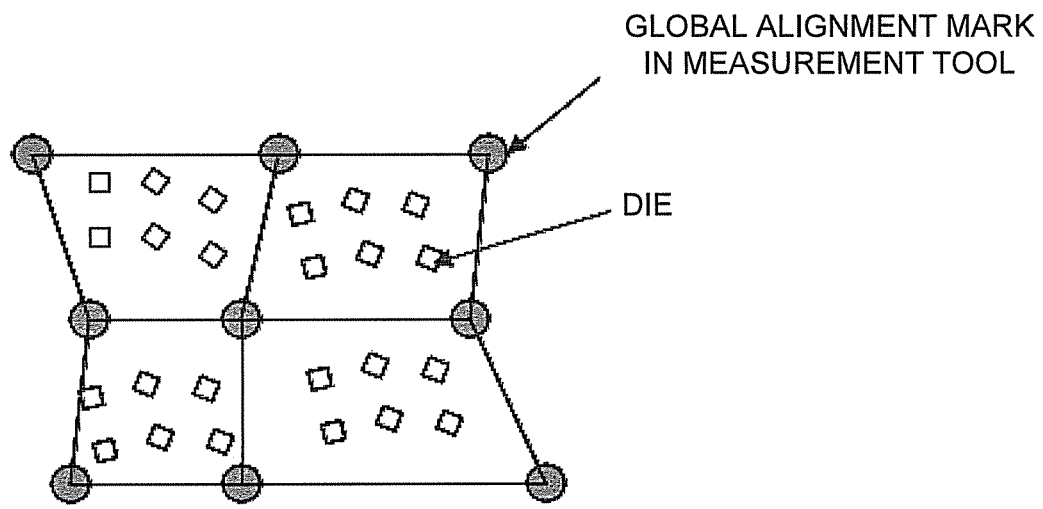
FIG. 1A illustrates example positions of global alignment marks on a workpiece in a measurement tool.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for the purposes of describing example embodiments. Example embodiments may be embodied in many alternate forms and should not be construed as limited to only the example embodiments set forth herein. Example embodiments are to cover all modifications, equivalents, and alternatives falling within the appropriate scope.

Although the terms first, second, etc. may be used herein to describe various elements, these elements should not be limited by these terms. These terms are only used to distinguish one element from another. For example, a first element could be termed a second element, and similarly, a second element could be ter a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular example embodiments only and is not intended to be limiting. As used herein, the singular forms "a," "an," and "the," are intended to include the plural forms as well, unless the context clearly indicates otherwise. The terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In some alternative implementations, the functions/acts noted may occur out of the order noted in the figures. For example, two figures shown in succession may in fact be executed substantially concurrently or may sometimes be executed in the reverse order, depending upon the functionality/acts involved.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, at least some example embodiments are described with reference to acts and symbolic representations of operations (e.g., in the form of flow charts, flow diagrams, data flow diagrams, process flow diagrams, partial process flow diagrams, structure diagrams, block diagrams, etc.), at least some of which may be implemented as program modules or functional processes including routines, programs, objects, components, data structures, etc., that perform particular tasks or implement particular abstract data types. These program modules and/or functional processes may be implemented using existing hardware at existing pattern generators, pattern generating apparatuses, measurement tools, measurement machines, combinations of these systems/apparatuses or the like. Such existing hardware may include one or more Central Processing Units (CPUs), digital signal processors (DSPs), application-specific-integrated-circuits (ASICs), field programmable gate arrays (FPGAs) computers or the like in addition to pattern generating equipment, such as laser direct imaging (LDI) writers and other pattern generating equipment. A pattern generation system according to an example embodiment will be discussed in more detail below.

As disclosed herein, the term "storage medium" or "computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks.

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Conventionally, measurement distortions measured in a measurement tool (e.g., due to global carrier warpage) are compensated for by the ordinary alignment function of a writing tool. Unfortunately, however, these distortions are included in the data comprising the more dense resampling of positions. As a result, the global warpage errors in the measurement tool lead to position errors when writing the pattern.

At least some example embodiments provide methods and apparatuses in which measured data is transformed using a transformation that is (at least partly) based on a deviation between the nominal positions of global alignment marks on a workpiece and the measured positions of global alignment marks on the workpiece, as measured in the measurement tool.

Figure 1B:
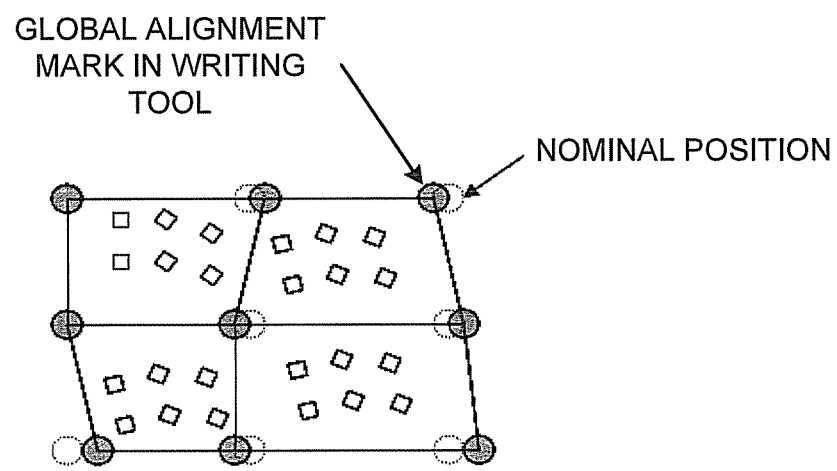
FIG. 1B illustrates example positions of global alignment marks on a workpiece in a writing tool.

FIG. 1A illustrates example positions of global alignment marks on a workpiece in a measurement tool. FIG. 1B illustrates example positions of global alignment marks on a workpiece in a writing tool.

As shown, the positions of the global alignment marks in the measurement tool are different from the positions of the global alignment marks in the writing tool. The difference between the positions of the global alignment marks may be caused by, for example, panel distortions due to loading, local heating of the panel, etc. As also shown, the positions of the global alignment marks in the writing tool are different from the nominal positions of the global alignment marks.

Additionally, as shown in FIGS. 1A and 1B, the positions of the dies (or die groups) on the workpiece are affected by the distortion (e.g., warpage) of the workpiece.

A conventional method for aligning a workpiece in a writing tool includes measuring positions of one or more global alignment marks on the workpiece and then comparing the measured positions of the global alignment marks with known nominal positions of the global alignment marks. Generally, however, information regarding die position and/or rotation obtained in the measurement tool is not obtained when the global alignment marks are at their nominal position because of the above-discussed panel distortions due to loading, local heating of the panel, etc. An example of this is shown in FIGS. 1A and 1B. Thus, without proper transformation, the use of this information may result in errors.

Example embodiments relate to methods and apparatuses for performing pattern alignment to die. Example embodiments also relate to methods and apparatuses for generating a pattern on a workpiece.

According to at least some example embodiments, an image may be written on a workpiece using a laser direct imaging (LDI) device to pattern a surface of the workpiece. Patterning by projecting, writing or printing a pattern on a surface of a workpiece may include exposing a photoresist or other photosensitive material, annealing by optical heating, ablating, creating any other change to the surface by an optical beam, etc.

As discussed herein, the term workpiece is used to denote any carrier of a surface layer upon which a pattern may be printed with a laser direct (or other) imaging (or pattern generation) system. For example, a workpiece may be a silicon substrate or a silicon wafer for a printed circuit board, an organic substrate, etc. Workpieces may have any shape (e.g., circular, rectangular, polygonal, etc.) and may have any size for example in a piece or in a roll.

The term die is used to denote a passive component, an active component, or any other component associated with electronics. For example, a die may be a small block of semiconducting material, on which a given functional circuit may be fabricated.

The term local alignment is used to denote alignment in relation to alignment features on an individual die or on a group of dies. An alignment feature may be a measurement mark, such as a local alignment mark, edge, corner, bump, pad, contact, text or other measurable feature of the die that provides a registration measure with relatively significant accuracy.

As discussed herein, the term global alignment denotes alignment in relation to alignment features on a workpiece. In this case, an alignment feature may be a measurement mark, such as a global alignment mark, edge, corner, bump, pad, contact, text or other measurable feature of the workpiece that provides a registration measure with relatively significant accuracy.

According to example embodiments, reading and writing are to be understood in a broad sense. Reading operations may include, for example, microscopy, inspection, metrology, spectroscopy, interferometry, scatterometry, etc. of a relatively small or relatively large workpiece. As mentioned above, writing may include exposing a photoresist or other photosensitive material, annealing by optical heating, ablating, creating any other change to the surface by an optical beam, etc.

Example embodiments provide methods and apparatuses which take into account workpiece distortion (e.g., global warpage) when exposing the workpiece to generate a pattern on the workpiece.

Figure 2:
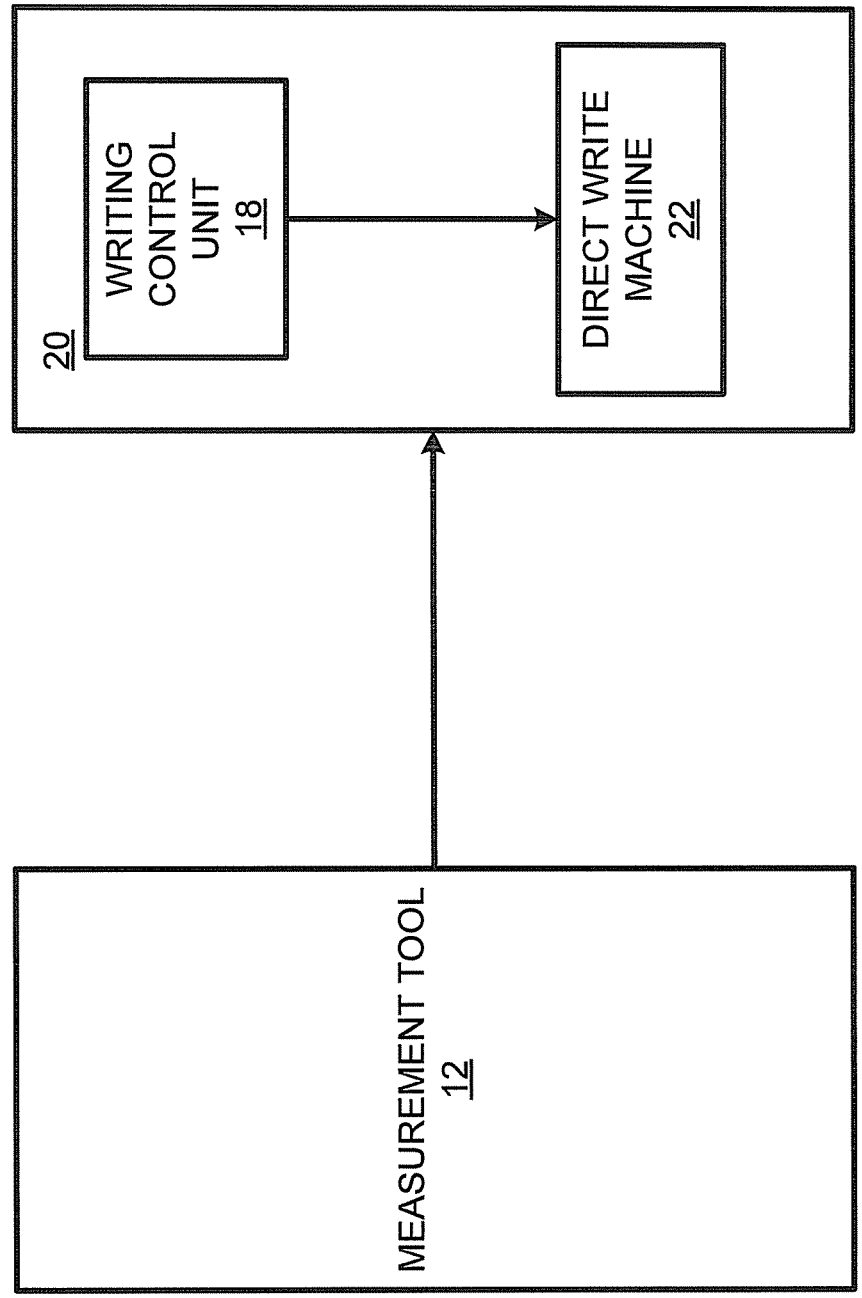
FIG. 2 is a block diagram of apparatus for generating a pattern on a workpiece according to an example embodiment.

FIG. 2 is a block diagram illustrating an example embodiment of an apparatus for generating a pattern on a workpiece.

Referring to FIG. 2, the apparatus includes a measurement tool 12 and a writing tool 20. The measurement tool 12 is external to, but coupled to, the writing tool 20. The measurement tool 12 may be any suitable measurement tool with sufficient accuracy and speed. In one example, the measurement tool 12 may be a conventional metrology tool or automated optical inspection (AOI) machine. In at least one example embodiment, the measurement tool 12 obtains global measurements relying on its own coordinate system, rather than measuring positions of dies relative to local alignment marks captured in the same image. Because metrology tools and AOI machines are generally known, a detailed discussion is omitted.

Still referring to FIG. 2, the writing tool 20 includes a writing tool control unit 18 and a direct write machine 22. The writing tool 20 may also include a measurement system (not shown).

In one example, the writing tool 20 may be a laser direct imaging (LDI) writer, the writing tool control unit 18 may be a LDI computer system, and the direct write machine 22 may be an LDI write machine. In at least this example embodiment, the writing tool control unit 18 is configured to control the writing tool 20 and the direct write machine 22. In one example, the writing tool control unit 18 provides the direct write machine 22 with a coordinate system for controlling writing/patterning/exposing operations on a workpiece.

Example operation of the apparatus shown in FIG. 2 will be discussed in more detail below with regard to FIGS. 3 through 6.

Figure 3:
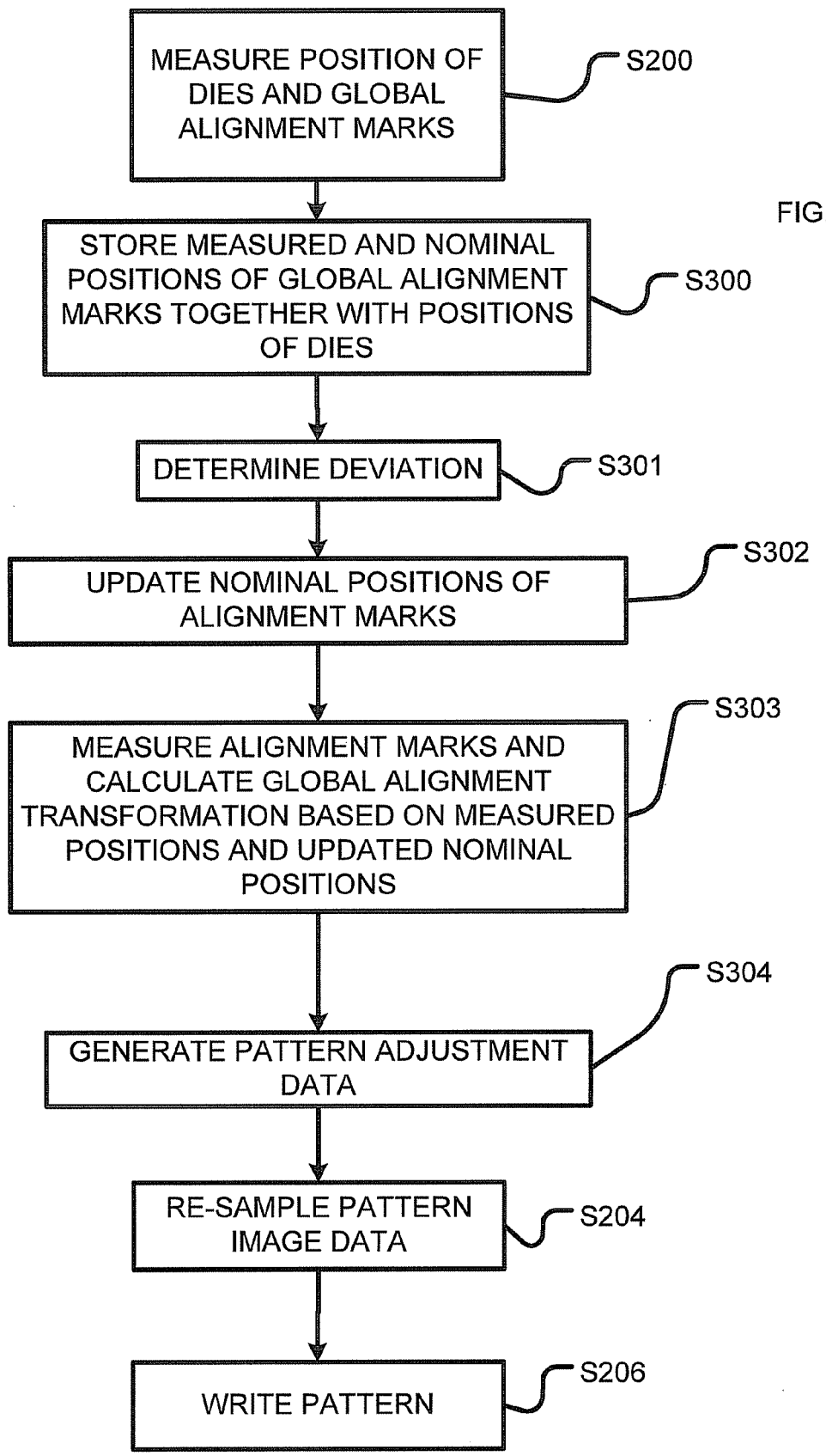
FIG. 3 is a flow chart illustrating an example embodiment of a method for generating a pattern on a workpiece.

FIG. 3 is a flow chart illustrating a method for generating a pattern on a workpiece according to an example embodiment. The method shown in FIG. 3 may be performed by the apparatus shown in FIG. 2, and will be described as such for example purposes. However, methods according to at least some example embodiments may be implemented in conjunction with other apparatuses for generating a pattern on a workpiece.

Figure 5:
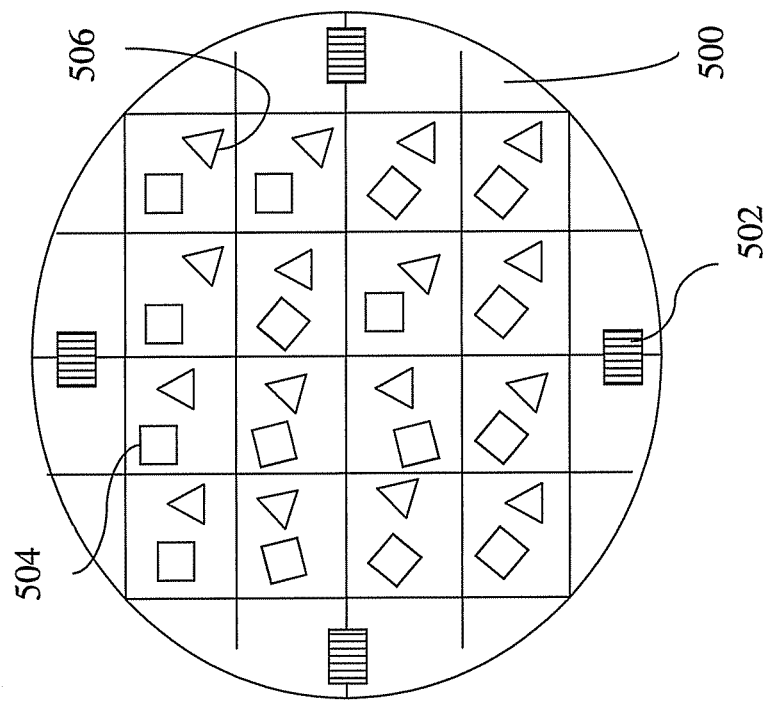
FIG. 5 shows a workpiece having global alignment marks, and provided with a plurality of arbitrarily placed dies of two different types.

FIG. 5 shows an example workpiece 500 having global alignment marks 502, and which is provided with a plurality of arbitrarily placed dies 504 and 506. The dies 504 are of a first type, whereas the dies 506 are of a second type. The example embodiment shown in FIG. 3 will also be discussed with regard to the example workpiece 500 shown in FIG. 5 for example purposes.

Example embodiments may be discussed herein with regard to the plurality of dies 504, 506 shown in FIG. 5. However, it should be understood that example embodiments may be applied in connection with workpieces having only a single die placed thereon or more than one die placed thereon.

Referring to FIG. 3, at S200 the measurement tool 12 measures the positions of one or more of the dies 504, 506 on the workpiece 500. Also at S200, the measurement tool 12 measures the actual positions of at least two of the global alignment marks 502 on the workpiece 500. As mentioned above, the measurement tool 12 may be an AOI machine. Because measurement methods used by AOI machines are generally known, a detailed discussion is omitted.

At S300, the measurement tool 12 stores the measured positions of the dies 504, 506 and the measured positions of the at least two global alignment marks 502 along with the known nominal positions of the global alignment marks 502 in a memory (not shown). The memory may be any non-volatile memory capable of storing measured position information/data.

At S301, the writing tool 20 obtains the stored information from the memory, and determines a deviation between the known nominal positions of the global alignment marks 502 and the measured positions of the global alignment marks 502 measured at the measurement tool 12. In one example, the deviation refers to the difference between the nominal positions of the global alignment marks 502 and the measured positions of the global alignment marks 502 measured by the measurement tool 12.

In a more specific example, the deviation may be represented as a dx,dy deviation of the measured positions of the global alignment marks 502 from the nominal positions of the global alignment marks 502. The deviation may be expressed as absolute coordinates, or as a deviation from the nominal positions of the global alignment marks 502.

At S302, the writing tool 20 updates the nominal positions of the global alignment marks 502 based on the determined deviation. In one example, the writing tool 20 updates the nominal positions of the global alignment marks 502 with the deviation between the nominal positions and the measured positions of the global alignment marks 502 measured in the measurement tool 12. For example, the writing tool 20 may update the nominal positions of the alignment marks 502 to the measured positions of the global alignment marks 502 measured in the measurement tool 12.

At S303, the writing tool 20 measures the positioning of the workpiece 500 as placed in the writing tool 20 in the coordinate system of the writing tool 20 (e.g., global position and warpage). In one example, the writing tool 20 measures positions of the global alignment marks 502 on the workpiece 500 as placed in the writing tool 20.

Still referring to S303, the writing tool 20 then calculates a global alignment transformation that describes the position of the workpiece 500 in the writing tool 20 based on the measured positions of the of the workpiece 500 in the writing tool 20 and the updated nominal positions determined at S302.

At S304, the writing tool control unit 18 generates pattern adjustment data using the global alignment transformation determined at S303. In one example, the pattern adjustment data refers to positions of the dies 504, 506 transformed (using the global alignment transformation) to the coordinate system of the writing tool 20. In this example, the coordinate system of the writing tool 20 is the global coordinate system, and the transformed positions of the dies 504, 506 are global alignment positions relative to the global alignment marks 502 of the workpiece 500.

According to example embodiments, the measured positions of the dies 504, 506 may be transformed to positions in the global coordinate system of the writing tool 20 by using a well defined relationship between the (measured) positions of the global alignment marks 502 relative to the local alignment marks on the workpiece 500, which is represented by the global alignment transformation.

If the distortion (e.g., warpage) of the workpiece in the writing tool 20 is the same as the distortion (e.g., warpage) of the workpiece in the measurement tool 12, then the writing tool 20 may measure a deviation (warpage) of zero between the measured positions and the nominal positions of the global alignment marks 502. Generally, this is an ideal case, and true if the actual positions of the global alignment marks are the same as the nominal positions of the global alignment marks. In this example, no global alignment is necessary in the writing tool 20, and the pattern data may be modified using only local measurement data, which yields sufficient results. In this example, the shape of the workpiece in the measurement tool 12 is used as the nominal shape of the workpiece. A similar situation may occur if the nominal positions of the global alignment marks are updated by the measured positions of the global alignment marks in the measurement tool 12 and the panel has the same warpage in the measurement tool 12 and the writing tool 20 as in at least some example embodiments.

Returning again to FIG. 3, at S204 the writing tool control unit 18 generates modified pattern image data based on the pattern adjustment data. For example, the writing tool control unit 18 may generate the modified pattern data by re-sampling the pattern image data based on the pattern adjustment data to fit the measured positions of the dies 504, 506 on the workpiece 500. More detailed examples of methods for re-sampling pattern image data are described, for example, in one or more of U.S. patent application Ser. Nos. 12/929,973, 12/929,975, 12/929,976, 12/929,977, and 12/929,981, all of which were filed on Feb. 28, 2011, the entire contents of each of which are incorporated herein by reference.

At S206, the direct write machine 22 generates a pattern on the workpiece 500 according to the modified (re-sampled) pattern image data. Examples of methods for generating a pattern on the workpiece 500 are described, for example, in one or more of U.S. patent application Ser. Nos. 12/929,973, 12/929,975, 12/929,976, 12/929,977, and 12/929,981.

Figure 4:
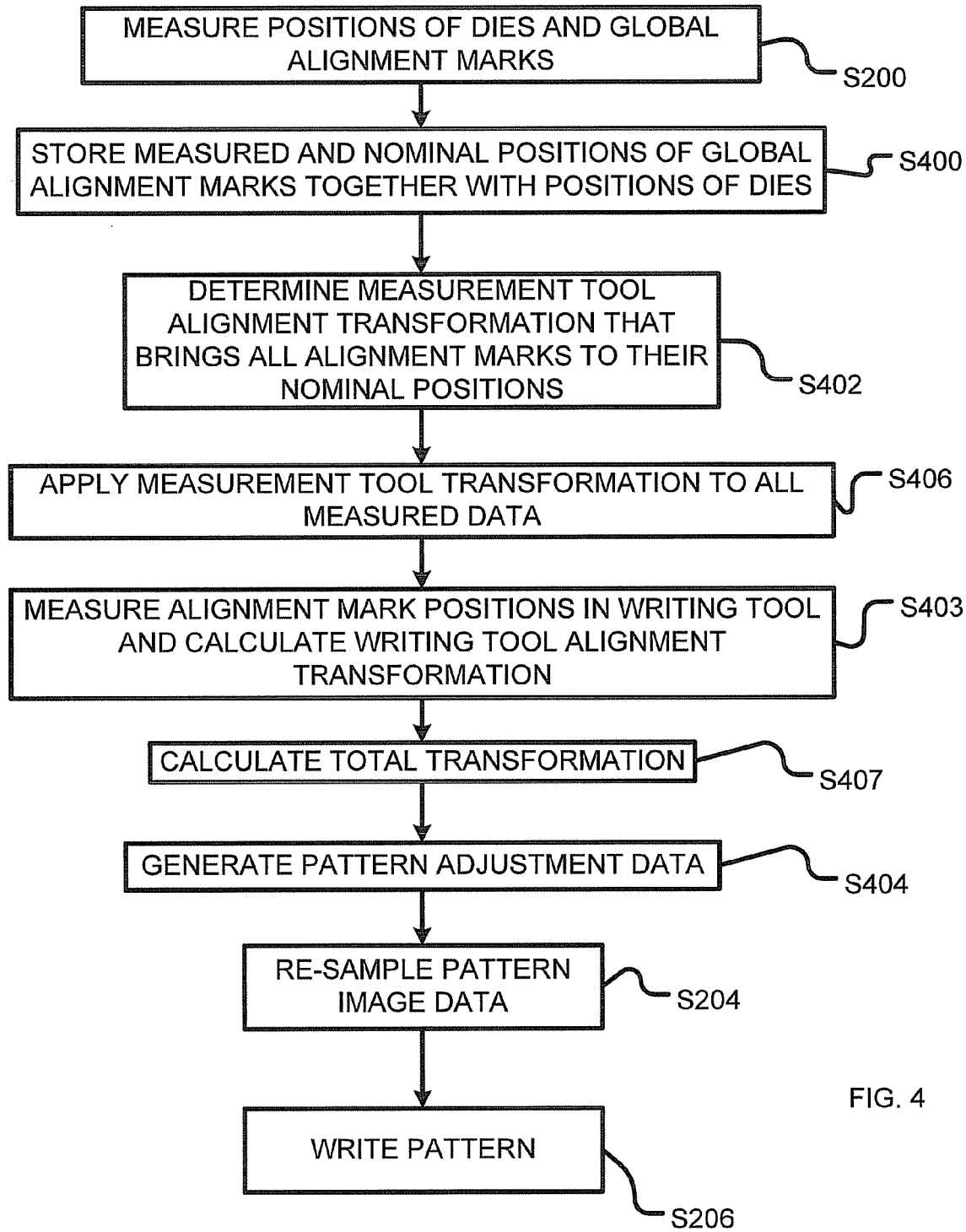
FIG. 4 is a flow chart illustrating another example embodiment of a method for generating a pattern on a workpiece.

FIG. 4 is a flow chart illustrating a method for generating a pattern according to another example embodiment. As with FIG. 3, the example embodiment shown in FIG. 4 will also be described with regard to FIGS. 2 and 5.

Referring to FIGS. 2, 4 and 5, at S200 the measurement tool 12 measures the positions of the dies 504, 506 and at least two of the global alignment marks 502 on the workpiece 500 in the same or substantially the same manner as discussed above with regard to S200 in FIG. 3.

At S400, the measurement tool 12 stores the measured positions of the dies 504, 506 and the measured positions of the at least two global alignment marks 502 along with the known nominal positions of the at least two of the global alignment marks 502 in a memory (not shown) in the same or substantially the same manner as discussed above with regard to S300 in FIG. 3.

At S402, the writing tool control unit 18 determines a measurement tool alignment transformation for the measured positions of the at least two global alignment marks 502 measured by the measurement tool 12 relative to the nominal positions of the at least two global alignment marks 502. In this example, the measurement tool alignment transformation is a transformation that brings the measured positions of the at least two global alignment marks 502 (measured at the measurement tool 12) to their nominal positions.

Although discussed herein with regard to use of a normal transformation, an inverse transformation may also be used. For example, if we assume that: Pn=nominal positions; and Pm=measured positions, then the normal transformation T that transforms Pm→Pn may be calculated. The manner in which such a transformation may be calculated is well-known, and thus, a detailed discussion is omitted. In this example, the inverse transformation $T_{inverse}$ is a transformation that brings points Pn→Pm.

If a normal transformation that takes Pn→Pm is calculated, then the inverse transformation $T_{inverse}$ brings points Pn to points Pm. Thus, according to at least some example embodiments, depending on how the transformation T is calculated, a transformation or an inverse transformation may be applied.

In another example, the measurements are compensated with a bi-linear interpolation that fulfills a boundary condition that all alignment marks should be at their nominal positions after adding the bi-linear compensation.

Still referring to S402, the writing tool control unit 18 may add and/or update positions of global alignment mark(s) with the measured positions, and then approximate the measurement tool alignment transformation (e.g., a polynomial fitting, splines, or some other non-linear transformation).

An example of a measurement tool alignment transformation is a projective transformation that capable of aligning four positions at their respective nominal positions. A projective transformation is a transformation type, which may be an inverse transformation or a normal transformation.

At S406, the writing tool 20 applies the measurement tool alignment transformation to all measured data from the measurement tool 12 to bring the measured positions to their nominal positions. In so doing, at S406, the writing tool 20 cleans the global warpage term from the measurement data from the measurement tool 12.

At S403, the writing tool 20 measures the positioning of the workpiece 500 as placed in the writing tool 20 in the coordinate system of the writing tool 20 (e.g., global position and warpage). In this example, the writing tool 20 measures the positions of the at least two global alignment marks 502, and compares the measured positions with the nominal positions of the global alignment marks 502.

Still referring to S403, the writing tool 20 then calculates a writing tool alignment transformation that describes the position of the workpiece 500 in the writing tool 20 based on the measured positions and the nominal positions of the global alignment marks 502. The writing tool alignment transformation may be linear (e.g., affine) or non-linear (e.g., polynomial based).

In one example, the writing tool alignment transformation may also be a projective transformation. If a projective transformation is used, each point may be moved to the correct position if the pattern is divided into subcells of four. However, example embodiments are not limited to this example. Rather, the writing tool alignment transformation may be used on all points at the same time if an imperfect fit on all points is acceptable.

At S407, the writing tool 20 calculates a total transformation based on the measurement tool alignment transformation and the writing tool alignment transformation.

The total transformation is a transformation that aligns the global alignment marks 502 at their respective nominal positions in the writing tool 20. In one example, the total transformation is obtained by combining the measurement tool alignment transformation described by the compensated measurement data with the writing tool alignment transformation from the alignment system of the writing tool 20.

In one example, the measurement tool alignment transformation and the writing tool alignment transformation are combined by adding the measurement tool alignment transformation with local transformations defined by local groups of measurement data calculated at S406. This transformation is also defined by finding the transformation that moves the measured positions/points to their nominal positions/points, or vice-versa.

At S404, the writing tool control unit 18 generates pattern adjustment data by converting/transforming the measured positions of the dies 504, 506 (obtained at S403) to the coordinate system of the writing tool 20.

In one example, the pattern adjustment data is generated by transforming the measured positions of the dies 504, 506 using the total transformation. In so doing, the writing tool control unit 18 re-calculates the measured die positions using the total transformation.

According to at least some example embodiments, the measurement data from the measurement tool 12 may include information regarding which measurements define a transformation and what position and size the transformation should cover. In one example, the measurement data from the measurement tool 12 may be in the format including: nominalPos, measuredPos, xOrigin, yOrigin, xSize, and ySize. In this example, xOrigin, yOrigin, xSize and ySize describe an area where the transformation that can be calculated/defined by the nominal and measured positions using various transformation methods (e.g., affine, projective, polynomial, etc.) is valid.

Returning to FIG. 4, at S204 the writing tool control unit 18 generates modified pattern image data for the pattern to be written on the workpiece 500 by re-sampling the pattern image data based on the pattern adjustment data to fit the measured positions of the dies 504, 506 on the workpiece 500. The operations performed at S204 are the same or substantially the same as those discussed above with regard to S204 in FIG. 3.

At S206, the direct write machine 22 generates the pattern on the workpiece 500 according to the modified pattern image data. The operations performed at S206 are the same or substantially the same as those discussed above with regard to S206 in FIG. 3.

Figure 6:
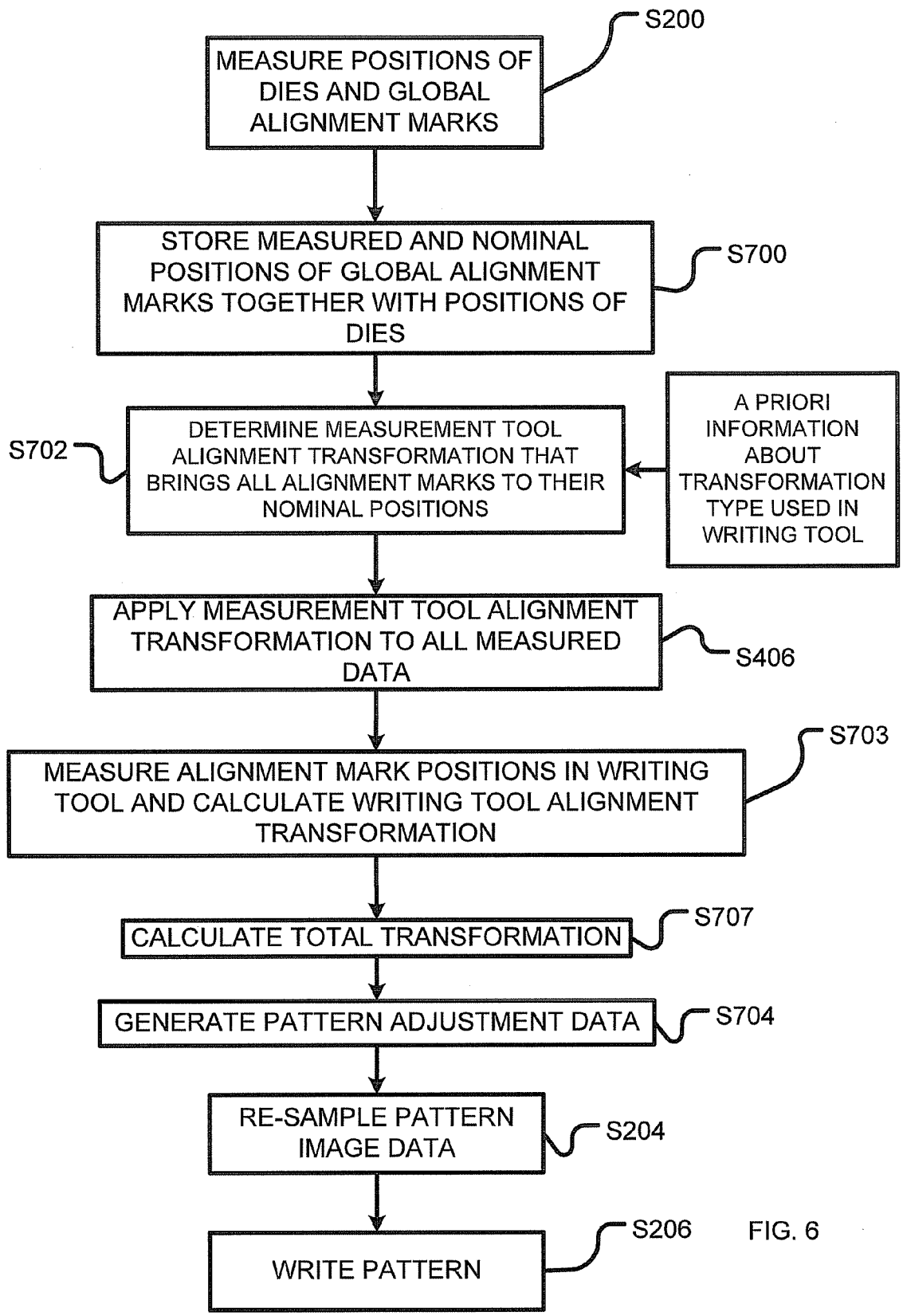
FIG. 6 is a flow chart illustrating yet another example embodiment of a method for generating a pattern on a workpiece.

FIG. 6 is a flow chart illustrating yet another method for generating a pattern on a workpiece according to an example embodiment. As with FIGS. 3 and 4, the example embodiment shown in FIG. 6 will be described with regard to FIGS. 2 and 5.

Referring to FIGS. 2, 5 and 6, at S200 the measurement tool 12 measures the positions of one or more dies 504, 506 and the positions of the at least two global alignment marks 502 on the workpiece 500 in the same or substantially the same manner as discussed above with regard to S200 in FIG. 3.

At S700, the measurement tool 12 stores the measured positions of the dies 504, 506, the measured positions of the two or more global alignment marks 502, and the known nominal positions of the global alignment marks 502 together in a memory in the same or substantially the same manner as discussed above with regard to S300 in FIG. 3.

At S702, the measurement tool 12 determines a measurement tool alignment transformation (or some other calculation that could be inversed in the writing tool 20) for the measured positions of the global alignment marks 502 measured by the measurement tool 12 relative to the nominal positions of the global alignment marks 502. In this example, the measurement tool 12 may also take into account a priori information about the transformation type used in the writing tool 20.

According to at least this example embodiment, the measurement tool 12 may add and/or update positions of global alignment mark(s), and then approximate the measurement tool alignment transformation by (e.g., polynomial fitting, splines, or some other non linear transformation). In this example, the measured positions are obtained and compensated with a estimated transformation that the writing tool 20 is capable of handling. Thus, this operation is similar to S402, except that the measurement tool alignment transformation is a transformation capable of being handled by the writing tool 20, whereas in S402 it is assumed that the writing tool 20 is able to perform a perfect global alignment. The measurement tool alignment transformation may be approximated in the same or substantially the same manner as discussed above with regard to FIG. 4, except that the writing tool 20 takes into account a priori information about limitations of the alignment capability of the writing tool 20 when determining the transformation.

For example, if the writing tool 20 has relatively limited capabilities to make advanced alignment transformations, then some part of the errors may be maintained because of the knowledge that the writing tool 20 cannot compensate for the errors in measurements of the global alignment marks, and there is a relatively high probability that the workpiece will have a similar or substantially similar shape in the writing tool 20 and the measurement tool 12. In this case, it may be suitable to update/maintain a portion of global errors measured in the measurement tool 12 based on a priori information about limitations of the alignment capability of the writing tool 20.

In at least this example embodiment, information about limitations in the writing tool 20 are used to calculate an optimal transformation. For example, if all panels have a static shape that the writing tool alignment system cannot compensate for 100%, then the portion that cannot be compensated may be maintained in the measurement data.

At S406, S703 and S707 in FIG. 6, the writing tool 20 performs the operations described above with regard to S406, S403 and S407, respectively, in FIG. 4, but with the measurement tool alignment transformation determined at S702.

At S704, the writing tool control unit 18 generates pattern adjustment data in the same or substantially the same manner as discussed above with regard to S304 in FIG. 3.

At S204, the writing tool control unit 18 generates modified pattern data for the pattern to be written on the workpiece 500 by re-sampling the pattern image data based on the pattern adjustment data to fit the measured positions of the dies 504, 506 on the workpiece 500. The operations performed at S204 in FIG. 6 are the same or substantially the same as those discussed above with regard to S204 in FIG. 3.

At S206, the direct write machine 22 generates the pattern on the workpiece 500 according to the re-sampled pattern image data. The operations performed at S206 in FIG. 6 are the same or substantially the same as those discussed above with regard to S206 in FIG. 3.

According to at least some example embodiments, if the global alignment mark(s) on the workpiece are at the same position (and/or can be compensated for by global rotation and/or translation), no additional compensation of the positions of the dies on the workpiece is necessary except for the individual die positions relative to the global coordinate system. This excludes global rotation and/or translation if already compensated for in accordance with the above discussion. Thus, if the workpiece is loaded in the same way in the measurement tool, and the writing tool is yielding with the global alignment marks in the same position as in the measurement tool, then no additional global alignment transformation is necessary (e.g., at least not within the zones of the carrier that should be exposed with a transformation that is associated with the die).

At least some example embodiments provide methods and apparatuses including compensating for measured positions (e.g., rotation, translation, shear, trapezoid, polynomial shapes, etc.) of dies produced in a measurement environment with distortions. Example embodiments compensate for nominal alignment mark positions in a writing tool for a specific workpiece, adjust the transformation (or inverse transformation) in the writing tool for the positions of the global alignment marks in the measurement tool relative to the nominal positions of the global alignment marks based on the transformation type used in the writing tool or an approximation thereof; and/or adjust the inverse transformation in the measurement tool for the positions of the global alignment marks in the measurement tool relative the nominal positions of the global alignment marks based on the transformation type used in the writing tool or an approximation thereof.

The foregoing description of example embodiments has been provided for purposes of illustration and description. It is not intended to be exhaustive or to limit the disclosure. Individual elements or features of a particular example embodiment are generally not limited to that particular embodiment, but where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for generating a pattern on a workpiece having at least one die placed thereon, the method comprising:
   measuring first positions of the at least one die and at least two global alignment marks on the workpiece as placed in a measurement tool;
   updating nominal positions of the at least two global alignment marks based on the measured first positions of the at least two global alignment marks;
   measuring second positions of the at least two global alignment marks on the workpiece as placed in a writing tool;
   calculating a global alignment transformation based on the updated nominal positions and the measured second positions of the at least two global alignment marks;
   generating pattern adjustment data by applying the global alignment transformation to the measured first positions of the at least one die on the workpiece;
   modifying pattern image data associated with the pattern based on the generating pattern adjustment data; and
   generating the pattern on the workpiece based on the modified pattern image data.

2. The method of claim 1, wherein the pattern image data is modified by re-sampling the pattern image data associated based on the pattern adjustment data.

3. The method of claim 2, wherein the generating of the pattern adjustment data comprises:
 transforming the measured first positions of the at least one die into a coordinate system of the writing tool using the global alignment transformation.

4. The method of claim 1, wherein the updating of the nominal positions comprises:
 calculating a deviation between the nominal positions and the measured first positions of the at least two global alignment marks; and
 updating the nominal positions based on the calculated deviation.

5. The method of claim 4, wherein the deviation is a dx,dy deviation of the measured first positions of the at least two global alignment marks from the nominal positions.

\* \* \* \* \*